United States Patent
Oh et al.

(10) Patent No.: US 11,245,021 B2
(45) Date of Patent: Feb. 8, 2022

(54) SILICENE ELECTRONIC DEVICE

(71) Applicant: Samsung Electronics Co., Ltd., Suwon-si (KR)

(72) Inventors: Youngtek Oh, Suwon-si (KR); Jinwook Jung, Daejeon (KR); Hyeokshin Kwon, Suwon-si (KR); Wontaek Seo, Yongin-si (KR); Insu Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/028,205

(22) Filed: Sep. 22, 2020

(65) Prior Publication Data
US 2021/0005731 A1    Jan. 7, 2021

Related U.S. Application Data

(63) Continuation of application No. 16/356,378, filed on Mar. 18, 2019, now Pat. No. 10,818,765.

(30) Foreign Application Priority Data

Oct. 25, 2018 (KR) ........................ 10-2018-0128534

(51) Int. Cl.
*H01L 29/45* (2006.01)
*H01L 29/786* (2006.01)
*H01L 29/16* (2006.01)

(52) U.S. Cl.
CPC .............. *H01L 29/45* (2013.01); *H01L 29/16* (2013.01); *H01L 29/78684* (2013.01); *H01L 29/78696* (2013.01)

(58) Field of Classification Search
CPC ... H01L 29/45; H01L 29/16; H01L 29/78684; H01L 29/78696
(Continued)

(56) References Cited

U.S. PATENT DOCUMENTS

| | | |
|---|---|---|
| 1,745,175 A | 1/1930 | Lilienfeld |
| 1,877,140 A | 9/1932 | Lilienfeld |

(Continued)

FOREIGN PATENT DOCUMENTS

| | | |
|---|---|---|
| KR | 100279052 B1 | 1/2001 |
| KR | 1020170065070 A | 6/2017 |

OTHER PUBLICATIONS

Tomonori Nishimura et al., "Evidence for strong Fermi-level pinning due to metal-induced gap states at metal/germanium interface" Appl. Phys. Lett. vol. 91, 123123 (2007).
(Continued)

*Primary Examiner* — Tong-Ho Kim
(74) *Attorney, Agent, or Firm* — Harness, Dickey & Pierce, P.L.C.

(57) ABSTRACT

A silicene electronic device includes a silicene material layer. The silicene material layer of the silicene electronic device has a 2D honeycomb structure of silicon atoms, is doped with at least one material of Group I, Group II, Group XVI, and Group XVII, and includes at least one of a p-type dopant region doped with a p-type dopant and an n-type dopant region doped with an n-type dopant. An electrode material layer including a material having a work function lower than the electron affinity of silicene is formed on the silicene material layer.

18 Claims, 6 Drawing Sheets

(58) Field of Classification Search
USPC .......................................................... 257/29
See application file for complete search history.

(56) References Cited

U.S. PATENT DOCUMENTS

| | | | |
|---|---|---|---|
| 1,900,018 | A | 3/1933 | Lilienfeld |
| 3,206,670 | A | 9/1965 | Atalla |
| 9,647,101 | B2 | 5/2017 | Oh |
| 10,818,765 | B2* | 10/2020 | Oh .......................... H01L 29/51 |
| 2016/0104790 | A1* | 4/2016 | Oh ........................ H01L 29/167 |
| | | | 257/29 |
| 2018/0197957 | A1 | 7/2018 | Maeda et al. |
| 2019/0295740 | A1 | 9/2019 | Nam et al. |
| 2020/0044041 | A1 | 2/2020 | Oh et al. |

OTHER PUBLICATIONS

S.M. Sze and Kwok K. Ng, "Physics of Semiconductor Devices" Complete Guide to Semiconductor Devices, 2nd ed., Wiley, New York (2002).
Paul M. Koenraad and Michael E. Flatte, "Single dopants in semiconductors" Nature Materials, vol. 10 (2011).
Robert Chau et al., "Integrated nanoelectronics for the future" Nature Materials, vol. 10, (2007).
Ruge Quhe et al., "Tunable and sizable band gap in silicene by surface adsorption" Scientific Reports, vol. 2, No. 853 (2012).
Gian G. Guzman-Verri and L.C. Lew Yan Voon, "Electronic structure of silicon-based nanostructures" Physical Review B, vol. 76, 075131 (2007).
Boubekeur Lalmi et al., "Epitaxial growth of a silicene sheet" Appl. Phys. Lett., vol. 97, 223109 (2010).
J. Sivek et al., "Adsorption and absorption of boron, nitrogen, aluminum, and phosphorus on silicene: Stability and electronic and phonon properties" Physical Review B, vol. 87, 085444 (2013).
Zeyuan Ni et al., "Tunable Bandgap in Silicene and Germanene" NANO Letters, vol. 12, pp. 113-118 (2011).
Takeshi Inoshita et al., "Exploration for Two-Dimensional Electrides via Database Screening and Ab Initio Calculation" Physical Review X, vol. 4, 031023 (2014).
Tomofumi Tada et al., "High-Throughput ab Initio Screening for Two-Dimensional Electride Materials" Inorganic Chemistry, vol. 53, pp. 10347-10358 (2014).
Takeshi Inoshita et al., "Probing a divergent van Hove singularity of graphene with a $Ca_2N$ support: a layered electride as a solid-state dopant" Physical Review B, vol. 96, 245303 (2017).
Yimao Wan et al., "A magnesium/amorphous silicon passivating contact for n-type crystalline silicon solar cells" Appl. Phys. Lett., vol. 109, 113901 (2016).
D. Udeshi et al., "Electrical characterization of interface stability between magnesium and selenium-passivated n-type silicon (001)" Intl. Journal of Electronics, vol. 92, No. 12, pp. 719-727 (2005).
"New Electride Made of Multiple Metals Discovered" Tokyo Institute of Technology (2017), https://www.titech.ac.jp/english/news/2017/039166.html.
Youngtek Oh et al., "Electric field effect on the electronic structure of 2D $Y_2C$ electride" 2D Materials, vol. 5, 035005 (2018).
Kimoon Lee et al., "Dicalcium nitride as a two-dimensional electride with an anionic electron layer" Nature, vol. 494, pp. 336-340 (2013).
Yanming Ma et al., "Transparent Dense Sodium" Nature, vol. 458, pp. 182-185 (2009).
Satoru Matsuishi et al., "High-Density Electron Anions in a Nanoporous Single Crystal: $[Ca_{24}Al_{28}O_{64}]^{4+}(4e^-)$" Science, vol. 301, pp. 626-629 (2003).
Yoshitake Toda et al., "Surface of Room-Temperature Stable Electride $[Ca_{24}Al_{28}O_{64}]^{4+}{}_{(e^-)4}$: Preparation and Its Characterization by Atomic-Resolution Scanning Tunneling Microscopy" ACS Nano, vol. 5, No. 3, pp. 1907-1914 (2011).
Youngtek Oh et al., "Electronic structure and switching behavior of the metastable silicene domain boundary" Appl. Phys. Lett, vol. 10, 263112 (2017).
Chun-Liang Lin et al., "Structure of Silicene Grown on Ag(111)" Applied Physics Express, vol. 5, 045802 (2012).
Lan Chen et al., "Evidence for Dirac Fermions in a honeycomb lattice based on silicon" Physical Review Letters (2012).
Toriumi/Nagashio Laboratory Research Activities, http://www.adam.t-u-tokyo.ac.jp/research_e.html (accessed Mar. 19, 2019).
Wei Liu et al., "Role of Metal Contacts in Designing High-Performance Monolayer n-Type $WSe_2$ Field Effect Transistors" NANO Letters, vol. 13, No. 5, pp. 1983-1990 (2012).
Non-Final Office Action dated Mar. 17, 2020 in U.S. Appl. No. 16/356,378.
Notice of Allowance dated Jun. 23, 2020 in U.S. Appl. No. 16/356,378.

* cited by examiner

SILICENE ELECTRONIC DEVICE

CROSS-REFERENCE TO RELATED APPLICATION

This application is a Continuation of U.S. application Ser. No. 16/356,378, filed on Mar. 18, 2019, which claims the benefit of Korean Patent Application No. 10-2018-0128534, filed on Oct. 25, 2018, in the Korean Intellectual Property Office, the disclosure of which is incorporated herein in its entirety by reference.

BACKGROUND

1. Field

The present disclosure relates to silicene electronic devices including a silicene material layer.

2. Description of the Related Art

Silicene is a material in which silicon atoms as an allotrope form a two-dimensional (2D) honey comb structure like graphene. Since silicene has the same structure as graphene, silicene has a similar band structure to graphene and electron transport is determined by the Dirac equation. Silicene is expected to have a mobility of approximately as high as $10^6$ cm$^2$/Vs, and also, an electronic device (hereinafter, a silicene electronic device) including a silicene material layer is expected to solve a physical limitation of Si devices of the related art. Furthermore, graphene may not use a silicon process of the related art, but since silicene includes silicon, an existing silicon process may be used for manufacturing a silicene electronic device.

In a silicon-based electronic device of the related art, the forming of an electrode plays an important role in reducing or preventing heat generation, reducing power consumption, and/or switching speed of devices. A metal-semiconductor contact is a Schottky contact, and thus, a barrier is formed. Many studies about methods of changing the Schottky contact to an ohmic contact have been conducted. In order to change a Schottky contact to an ohmic contact, a method of reducing a Schottky contact width (SBW) or reducing a Schottky contact height (SBH) has been used. For example, in the related art, an ohmic contact has been achieved by reducing the SBW by doping a Schottky contact part with a higher concentration dopant by using an implantation method.

However, in the case of the silicene electronic device, since silicene has a very small thickness with a single layer or a double layer, it is not easy to form an ohmic contact by using a method of the related art.

SUMMARY

Provided are silicene electronic devices, for example, switching devices, such as transistors including a silicene material layer.

Additional aspects will be set forth in part in the description which follows and, in part, will be apparent from the description, or may be learned by practice of the presented embodiments.

According to an aspect of some embodiments, a silicene electronic device includes: a silicene material layer having a two-dimensional (2D) honeycomb structure formed by silicon atoms, is doped with at least one material of Group I, Group II, Group XVI, and Group XVII, and comprises at least one of a p-type dopant region doped with a p-type dopant and an n-type dopant region doped with an n-type dopant; and an electrode material layer on the silicene material layer and includes a material having a work function lower than the electron affinity of silicene.

The electrode material layer may include an electride.

The electride may include a C12A7 electride, a 2D electride, and a $Y_5Si_3$ electride.

The 2D electride may be an anisotropic 2D electrode or a polycrystal electride. The 2D electride may include, for example, $Ca_2N$, $Y_2C$, or $Gd_2C$.

The electrode material layer may include at least one material selected from the group consisting of Mg, Ca, Y, La, and Er.

An intermediate layer may further be arranged between the silicene material layer and the electrode material layer. The intermediate layer may be a passivation layer or an insulating layer formed on a surface of the silicene material layer. The passivation layer may include Se or S. The insulating layer may include boron nitride (BN), $SiO_2$, or SiN. The insulating layer may be formed on an entire upper surface of the silicene material layer.

The silicene electronic device may further include a graphene layer between the intermediate layer and the electrode material layer.

An electrode material protection layer protecting the electrode material layer may further be formed. The electrode material protection layer may be a metal layer. The electrode material protection layer may cover an area greater than an area of the electrode material layer so that side surfaces of the electrode material layer are not exposed to the outside of the electrode material protection layer.

The silicene material layer may be entirely doped with at least one material of Group I, Group II, Group XVI, and Group XVII, and may include at least one p-type dopant region and at least one n-type dopant region.

A doping concentration of an n-type dopant in the n-type dopant region may be $10^{12}$~$10^{18}$/cm$^3$.

A doping concentration of a p-type dopant in the p-type dopant region may be $10^{12}$~$10^{18}$/cm$^3$.

The silicene material layer may include at least one p region doped with a p-type dopant and at least two n+ regions doped with an n-type dopant on both sides of the p region, wherein a gate electrode having a width equal to or greater than a width of the at least one p region is formed on the p region, and a source and a drain are formed on the at least two n+ regions.

A gate insulating layer may further be formed between the gate electrode and the silicene material layer, and a gate intermediate layer may further be formed between the silicene material layer and the gate insulating layer.

The gate intermediate layer may include one of BN, $SiO_2$, and SiN. The gate intermediate layer may be formed on an entire upper surface of the silicene material layer and may be formed as one body with the intermediate layer (insulating layer).

The silicene electronic device may further include a lower intermediate layer provided on a lower surface of the silicene material layer.

The lower intermediate layer may include one of BN, $SiO_2$, and SiN.

The silicene electronic device may further include a lower gate insulating layer and a lower gate electrode on a lower side of the silicene material layer.

The lower gate electrode may have a width equal to or greater than a width corresponding to the at least two n+ region and the at least one p region of the silicene material layer.

The silicene electronic device may include a silicene material layer having a two-dimensional (2D) honeycomb structure formed by silicon atoms, is doped with at least one material of Group I, Group II, Group XVI, and Group XVII, and includes a low doping concentration region lowly doped with at least one of p-type dopant or an n-type dopant, and a high doping concentration region highly doped with at least one of p-type dopant or an n-type dopant, and an electrode material layer formed on the high doping concentration region.

The silicene material layer may be formed as a single layer or a bi-layer, and the highly doping region may be doped by substitution of adsorption of a dopant.

The silicene material layer may include a first region formed as a single layer or a bi-layer and a second region formed as a multilayer, and the highly doped region may be formed in the second region.

A doping concentration of the low doping concentration region may be in a range of $10^{12}$~$10^{18}$/cm$^3$, and a doping concentration of the low doping concentration region may be in a range of $10^{18}$~$10^{21}$/cm$^3$.

The silicene material layer may include a p region doped with a p-type dopant and n+ regions respectively doped with an n-type dopant on both sides of the p region, and the highly doping region may be n+++ region formed on a portion of the n+ region.

The silicene electronic device according to the present disclosure may provide a new method for forming an ohmic contact of an electrode. For example, a new method of forming an ohmic contact on a source and a drain of a field effect transistor (FET) of a nanometer level may be provided.

The silicene electronic device according to the present disclosure may contribute process simplification by reducing an implantation method.

The silicene electronic device according to the present disclosure may provide a dopant-free process on a contact region since an implantation process is simplified.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Figure 1:
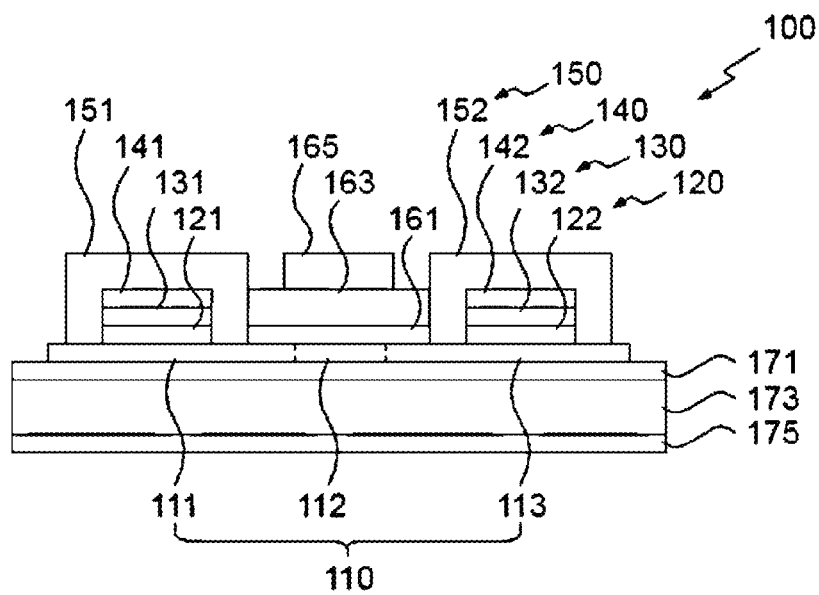
FIG. 1 is a cross-sectional view of a silicene electronic device including a silicene material layer according to some embodiments.

Reference will now be made in detail to embodiments, examples of which are illustrated in the accompanying drawings. The embodiments may, however, be embodied in many different forms and should not construed as limited to the embodiments set forth herein. Rather, these embodiments are provided so that this disclosure will be thorough and complete, and will fully convey the scope of the invention to those of ordinary skill in the art. The embodiments will be defined by the appended claims. In the entire specification, like reference numerals refer to like elements throughout and, in the drawings, sizes and thicknesses of constituent elements are exaggerated for clarity of explanation.

Terminology used in the specification will be briefly described and the embodiments will be described in detail.

Terminology used herein are selected as commonly used by those of ordinary skill in the art in consideration of functions of the embodiments, but may vary according to the technical intention, precedents, or a disclosure of a new technology. Also, in particular cases, some terms are arbitrarily selected by the applicant, and in this case, the meanings of the terms will be described in detail at corresponding parts of the specification. Accordingly, the terms used in the specification should be defined not by simply the names of the terms but based on the meaning and contents of the whole specification.

It should be understood that, when a part "comprises" or "includes" an element in the specification, unless otherwise defined, it is not excluding other elements but may further include other elements.

Reference will now be made in detail to embodiments, examples of which are illustrated in the accompanying drawings. In this regard, the embodiments may have different forms and should not be construed as being limited to the descriptions set forth herein. Accordingly, the embodiments are merely described below, by referring to the figures, to explain aspects. In the drawings, for clarity of explanation of the disclosure, parts that are not related to the descriptions may be omitted.

Figure 2:
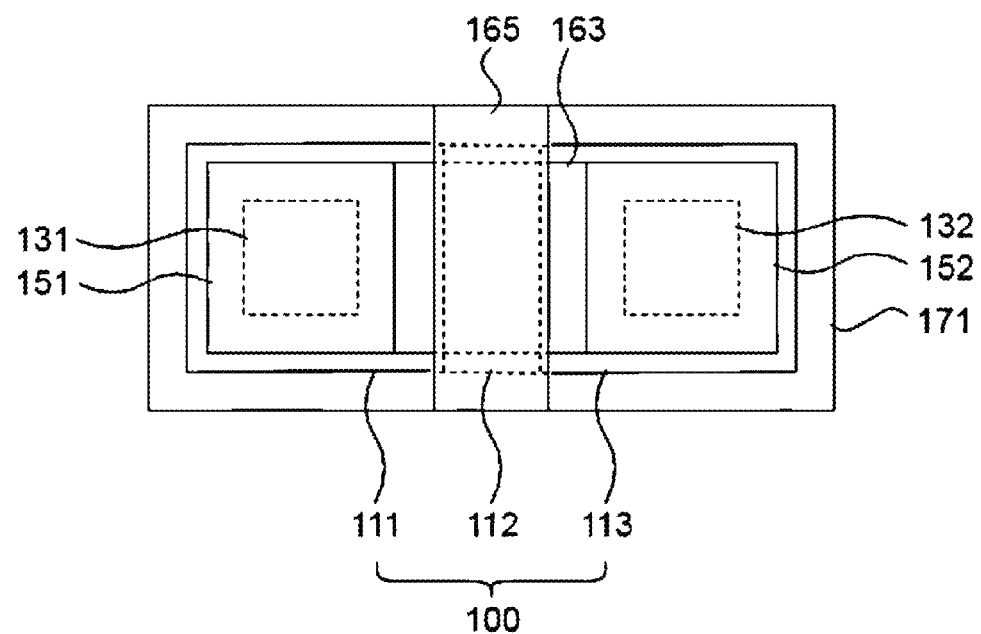
FIG. 2 is a plan view of the silicene electronic device of FIG. 1.

FIG. 1 is a cross-sectional view of a silicene electronic device 100 including a silicene material layer 110 according to some embodiments. FIG. 2 is a plan view of the silicene electronic device 100 of FIG. 1. In some embodiments, the silicene material layer 110 is formed as a channel and a transistor having a structure in which an upper gate 165 and a lower gate 175 are provided.

Referring to FIGS. 1 and 2, the silicene electronic device 100 according to some embodiments may include the silicene material layer 110, an intermediate layer 120 on the silicene material layer 110, a graphene layer 130 on the intermediate layer 120, an electrode material layer 140 on the graphene layer 130, and/or an electrode material protection layer 150 on the electrode material layer 140.

Figure 3:
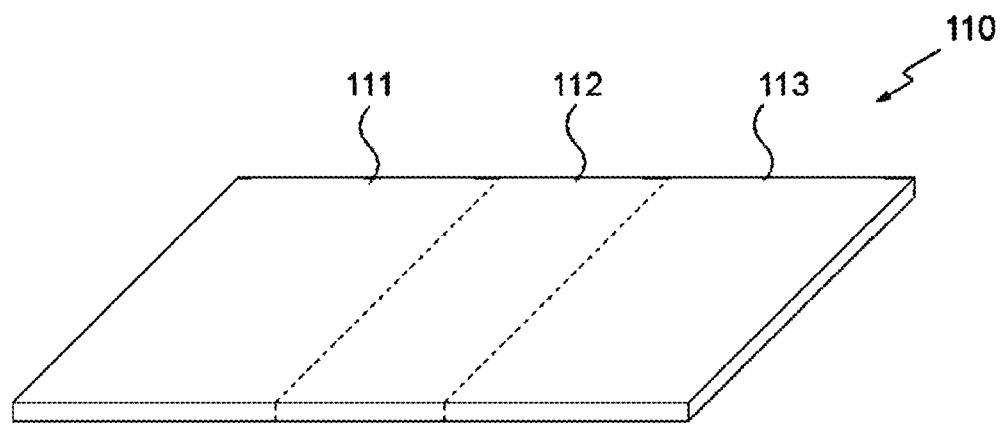
FIG. 3 is a perspective view of a silicene material layer of the silicene electronic device of FIG. 1.

The silicene material layer 110 may be a channel of a transistor device. Referring to FIG. 3, the silicene material layer 110 may be a layer in which silicon atoms form a 2D honeycomb structure. Silicene of the silicene material layer 110 may be primarily doped with at least one material of Group I, Group II, Group XVI, and Group XVII. For example, silicene of the silicene material layer 110 may be primarily doped with at least one material of Group I, such as Li, Na, and K, Group II, such as Be, Mg, and Ca, and Group VII, such as F, Cl, and Br. When the silicene material layer 110 is doped with a primarily dopant, such as a material of Group I, Group II, Group XVI, and Group XVII, a bandgap of the silicene material layer 110 may be opened and controlled. As the doping concentration of the primarily dopant with respect to the silicene material layer 110 increases, the bandgap of the silicene material layer 110 may be increased.

In a state that the silicene material layer 110 is primarily doped, a secondary doping may be performed by using a p-type dopant or an n-type dopant. For example, when the doping is performed by using an implantation method, the p-type dopant may be B or Al, and the n-type dopant may be P. Furthermore, the silicene material layer 110 may be doped by using a substation method or an adsorption method. When the substation method is used, the p-type dopant may be B or Al, and the n-type dopant may be N or P. When the adsorption method is used, the p-type dopant may be N, and the n-type dopant may be B or Al. However, the second dopant is not limited thereto, and a p-type dopant and an n-type dopant generally used in a semiconductor process may be used. Reference numerals 111, 112, and 113 of FIG. 3 indicate regions doped with second dopants, for example, reference numerals 111 and 113 may be n+-regions of the silicene material layer 110 doped with an n-type dopant, and reference numeral 112 may be p-regions doped with a p-type dopant. As another example, reference numerals 111 and 113 may be p+-regions of the silicene material layer 110 doped with a p-type dopant, and reference numeral 112 indicates an n-region doped with an n-type dopant. In this way, the silicene material layer 110 according to some embodiments may include an NPN or PNP doping region, but the present embodiments are not limited thereto, and the silicene material layer 110 may include at least one of a p-type dopant region and an n-type dopant region.

In this way, the silicene material layer 110 according to some embodiments may have a 2D structure in which silicon atoms form a hexagonal honeycomb structure, and may be a mono-layer or a bi-layer. The silicene material layer 110 may include a double doped region in which both a primary doping material and a secondary doping material are doped. The silicene material layer 110 may be doped with the primary doping material and the secondary doping material to have respective doping concentrations of $10^{12}$~$10^{21}$/cm$^3$ and $10^{12}$~$10^{18}$/cm$^2$ by an injection method, and the primary doping material and the secondary doping material respectively substituted by silicon atoms having a hexagonal net structure of the silicene material layer 110 or may be present as an interstitial type dopant included between the silicon atoms. A silicon material layer used in general electronic devices is in a bulk state, and a large number of silicon layers form a multi-layer structure. However, the silicene material layer 110 according to some embodiments may have a hexagonal 2D structure like graphene, may have a high mobility, and/or may readily control a bandgap characteristic by a doping material.

Figure 4A:
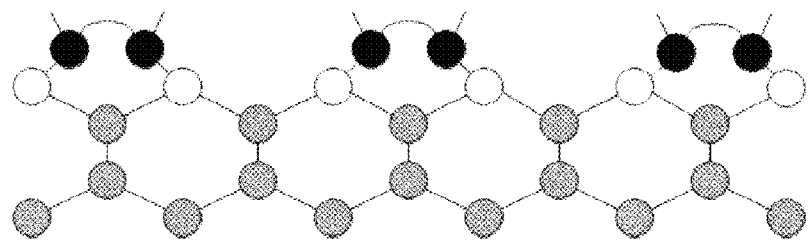
FIG. 4A is a lateral view seen from a [011] direction of restructured Si(001)
Figure 4B:
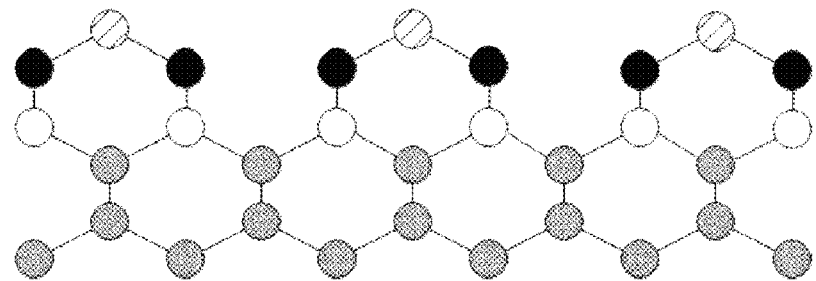
FIG. 4B is diagram showing a case that a surface of Si(001) is passivated with Se.

Referring to FIGS. 1 and 2, the intermediate layer 120 may include first and second intermediate layers 121 and 122 arranged in the regions 111 and 113. The intermediate layer 120 may be provided to protect the silicene material layer 110 or to reduce or prevent the silicene material layer 110 from reacting with other material layers. The intermediate layer 120 may be formed by passivating surfaces of the regions 111 and 113 with Se or S. As an example, FIG. 4A is a lateral view seen from a [011] direction of restructured Si(001), and FIG. 4B is diagram showing a case that a surface of Si(001) is passivated with Se. The passivated intermediate layer 120 having a small thickness may be formed, for example, a thickness in a range from a single layer to five atom layers. In this way, since a surface of the silicene material layer 110 is passivated, a dangling bond that may be present on the surface of the silicene material layer 110 may be removed. As another example, the intermediate layer 120 having a small thickness may be formed by using an insulating material, such as BN, SiO$_2$, SiN, or TiO$_2$, for example, a thickness in a range from a single layer to five atom layers. For example, BN does not change the characteristics of silicene when BN joins with silicene. As described below, when the electrode material layer 140 having a low work function is used, there is a risk of occurring a Fermi-level pinning phenomenon in which Fermi-level is fixed to a certain level through interface states of silicon surface. However, according to some embodiments, the intermediate layer 120 is inserted between the silicene material layer 110 and the electrode material layer 140, and thus, the formation of an interface state on the surface of the silicene material layer 110 may be reduced or prevented and a Fermi-level pinning phenomenon may be reduced or prevented. As described below, when the electrode material layer 140 shows a stable characteristic or is silicide, the intermediate layer 120 may be omitted.

The electrode material layer 140 includes first and second electrode material layers 141 and 142 formed on the first and second intermediate layers 121 and 122. The first and second electrode material layers 141 and 142 may be understood as a source and a drain, respectively.

The electrode material layer 140 may be formed by using a material having a low work function (hereinafter, a low work function material) lower than the electron affinity of silicene. Since the electron affinity of silicon Si is approximately 4.05 eV, the electrode material layer 140 may be formed by using a material having a work function less than approximately 4 eV. For example, the electrode material layer 140 may be formed by using a material having a work function greater than about 2.5 eV and less than about 3.5 eV.

For example, the electrode material layer 140 may be formed by using an electride, such as a 12CaO$_7$Al$_2$O$_3$ (C12A7) electride, a 2D electride, and an Y$_5$Si$_3$ electride.

When the C12A7 electride is used as the electrode material layer 140, a TiO$_2$ insulating layer is generated in a process of forming the C12A7 electride, and thus, the TiO$_2$ insulating layer may be used as the intermediate layer 120. Also, the C12A7 electride may be formed as a single layer, and thus, may be formed by using a deposition method, for example, sputtering.

The 2D electride may include an anisotropic 2D electride or a polycrystalline electride. The 2D electride may include Ca$_2$N, Y$_2$C, and Gd$_2$C. The 2D electride has a high mobility in an applied-channel direction and has a further low work function in a direction in which a channel is formed, and thus a further better ohmic contact may be obtained by forming a contact in a channel direction. Also, in the case of the polycrystalline electride, a further lower work function may be obtained, and thus, a further better ohmic contact may be obtained.

When the $Y_5Si_3$ electride is used as the electrode material layer 140, $Y_5Si_3$ itself is already silicide, and thus, even though the electrode material layer 140 contacts the silicene material layer 110, additional silicide is not formed, and accordingly, a Schottky barrier is not generated. Accordingly, in this case, the intermediate layer 120 and the graphene layer 130 may be omitted. Also, $Y_5Si_3$ shows stable characteristics in moisture and air, and thus, the electrode material protection layer 150 described below may be omitted.

As another example, the electrode material layer 140 may be formed by including a material selected from the group consisting of Mg, Ca, Y, La, and Er.

Table 1 below shows work the function of materials.

TABLE 1

| Materials | Work function (eV) |
| --- | --- |
| C12A7 | 2.4 |
| $Ca_2N$ | 2.6 |
| $Y_2C$ | 2.84 |
| $Gd_2C$ | 2.85 |
| Ca | 2.87 |
| Y | 3.1 |
| Gd | 3.1 |
| La | 3.5 |
| Mg | 3.66 |
| Hf | 3.9 |
| Al | 4.28 |
| Ti | 4.33 |
| Ni | 5.15 |

As described above, since the silicene material layer 110 is formed as a single layer or a double layer of silicene, when an implantation method is used, a doping concentration of a p-type dopant or an n-type dopant may be limited to a range of $10^{12}$~$10^{18}$/$cm^3$. Thus, when a metal, such as Al, Ti, and Ni, is joined in this doping concentration, a Schottky barrier may be formed. The relationships between the Schottky barrier, work function, and electron affinity are as follows. As shown in Equation 1, when a work function of a material that formed the electrode material layer 140 is lower than the electron affinity of silicene, a Schottky barrier may be substantially disappeared, and accordingly, the electrode material layer 140 may form an ohmic contact with the silicene material layer 110.

$$\phi_B = \phi_M - X \quad \text{[Equation 1]}$$

Here, $\phi_B$ indicates Schottky barrier, $\phi_M$ indicates work function, and X indicates electron affinity.

Also, when the size of the silicene electronic device 100 is in a nm level, an implantation concentration may not be uniform, and thus, the formation of an ohmic contact may be difficult. However, since a high doping concentration region (for example, an N+++ region) is not required by forming the ohmic contact using a material having a work function lower than silicene, and thus, an implantation process is simplified and a dopant-free process in the joining region may be provided.

Furthermore, to realize a Fin FET in which a silicene material layer is used as a channel layer, the doping of silicene may be difficult by using virtually the implantation method due to the very small thickness of the silicene. However, the forming of an ohmic contact by using a material having a low work function allows the manufacturing of the Fin FET to be easier.

The graphene layer 130 may include first and second graphene layers 131 and 132 formed on the first and second intermediate layers 121 and 122. The graphene layer 130 may include a single layer. The graphene layer 130 may reduce or prevent oxidation of the silicene material layer, and also, may additionally reduce a work function of the silicene material layer. Table 2 below shows work functions with respect to $Ca_2N(001)$, MLG/$Ca_2N(001)$, and BLG/$Ca_2N(001)$. Referring to Table 2, it is seen that a work function is further reduced since the graphene layer 130 and the electrode material layer 140 have a double layer structure.

TABLE 2

| Materials | Work function (eV) |
| --- | --- |
| $Ca_2N$ | 3.39, 3.43, 3.5 |
| MLG/$Ca_2N$ | 2.95 |
| BLG/$Ca_2N$ | 3.47 |
| MLG | 3.94, 4.26 |
| BLG | 3.97, 4.28 |

Also, since graphene is a 2D material like silicene, it is easy to form the graphene layer 130 on the silicene material layer 110. When the electrode material layer 140 is very stable or has a sufficiently low work function, the graphene layer 130 may be omitted.

The electrode material protection layer 150 is formed on the electrode material layer 140. The electrode material protection layer 150 may include first and second electrode material protection layers 151 and 152 covering the first and second electrode material layers 141 and 142, respectively. The electrode material protection layer 150 reduces or prevents the electrode material layer 140 from oxidation. The electrode material protection layer 150 may include a metal. The electrode material protection layer 150 may be formed not to expose sides of the electrode material layer 140 by depositing a metal on a region greater than an area of the electrode material layer 140. As another example, when the electrode material layer 140 shows a stable characteristic like $Y_5Si_3$, the electrode material protection layer 150 may be deposited on an upper surface of the electrode material layer 140 or the electrode material protection layer 150 may be omitted.

An upper gate intermediate layer 161, an upper gate insulating layer 163, and/or an upper gate electrode 165 may be formed on a region between regions where the first and second electrode material layers 141 and 142 are formed. A lower intermediate layer 171, a lower gate insulating layer 173, and a lower gate electrode 175 may be formed on a lower side of the silicene material layer 110.

The upper gate intermediate layer 161 and the lower intermediate layer 171 are selectively formed to protect the silicene material layer 110 or to reduce or prevent the silicene material layer 110 from reacting with other material layers. The upper gate intermediate layer 161 and the lower intermediate layer 171 may be formed by using a material having a low reactivity with the silicene material layer 110, for example, an insulating material such as, boron nitride (BN), $SiO_2$, and SiN, and as thin as possible in a thickness range from a single layer to five atom layers The upper and lower gate insulating layers 163 and 173 may include silicon oxide or a high-k material having a dielectric constant greater than the silicon oxide. For example, the upper and lower gate insulating layers 163 and 173 may include silicon oxide, such as $SiO_2$, a silicon nitride, such as $Si_3N_4$, aluminum oxide, zirconium oxide, hafnium oxide, etc.

The upper and lower gate electrodes 165 and 175 may include a conductive material, that is, a material that is used as an electrode material in electronic devices, for example, conductive metal oxide, conductive nitride oxide, and a conductive polymer may be used without limitation. The upper gate electrode 165 may be formed on a region corresponding to a central part of the silicene material layer 110, for example, when the silicene material layer 110 includes an NPN doping region, the upper gate electrode 165 may be formed on a region corresponding to the region 112 which is region doped with a p-type dopant. When the silicene material layer 110 includes an NPN doping region, the upper gate electrode 165 may have a width equal to or a slightly greater than a width of the p-type doping region (the region 112). When the silicene material layer 110 includes a PNP doping region, the upper gate electrode 165 may have a width equal to or a slightly greater than a width of the n-type doping region. The lower gate electrode 175 may be formed to have a width greater than that of the upper gate electrode 165. That is, when the silicene material layer 110 is doped of an NPN type or a PNP type, the upper gate electrode 165 is formed to have substantially equal to or similar to a central doping region (the region 112), but the lower gate electrode 175 may be formed to have a width corresponding to both the NPN type or the PNP type doping regions of the silicene material layer 110.

A primary doping is performed by using a material like an alkali metal to open a band gap of the silicene material layer 110. In the doping of the silicene material layer 110 with an alkali metal, theoretically, a band gap of silicene may be present at a lower position than a Fermi level. Therefore, a whole chemical potential of the silicene material layer 110 is moved by applying a voltage to the lower gate electrode 175 so that the Fermi level is located between the band gap, and thus, the silicene material layer 110 may have a semiconductor characteristic. When a voltage is applied to the upper gate electrode 165, a channel is formed.

Figure 5:
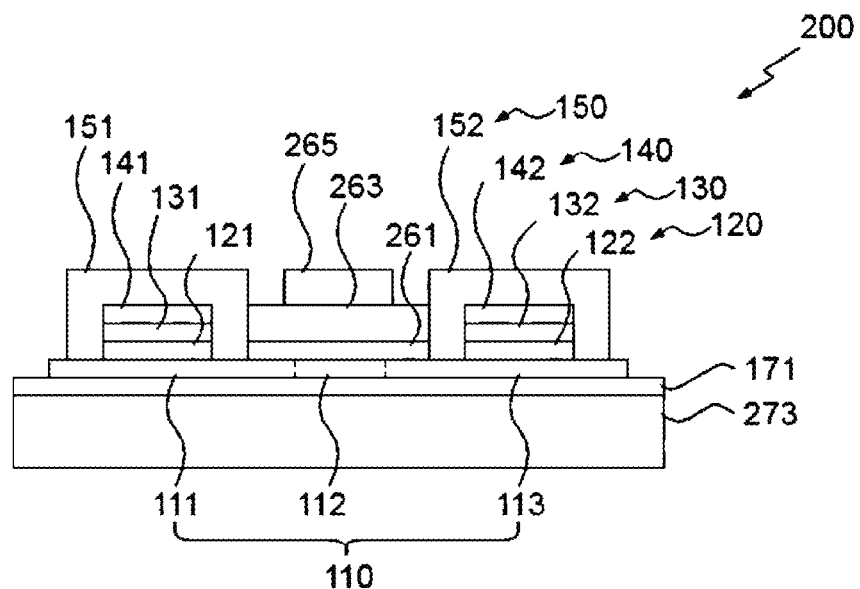
FIG. 5 is a cross-sectional view of a silicene electronic device including a silicene material layer, according to some embodiments.

FIG. 5 is a cross-sectional view of a silicene electronic device 200 including a silicene material layer 110 according to some embodiments.

Referring to FIG. 5, the silicene electronic device 200 according to some embodiments is substantially identical to the silicene electronic device 100 described with reference to FIGS. 1 through 4 except that a gate electrode 265 is formed only on the silicene material layer 110, and thus, only the differences will be described.

The silicene electronic device 200 may include a silicene material layer 110 on a lower structure 273, an intermediate layer 120 on the silicene material layer 110, a graphene layer 130 on the intermediate layer 120, an electrode material layer 140 on the graphene layer 130, and/or an electrode material protection layer 150 on the electrode material layer 140. The intermediate layer 120 may include first and second intermediate layers 121 and 122 formed on regions 111 and 113. The electrode material layer 140 may include first and second electrode material layers 141 and 142 formed on the first and second intermediate layers 121 and 122. The first and second electrode material layers 141 and 142 may be understood as a source and a drain, respectively. A gate intermediate layer 261, a gate insulating layer 263, and a gate electrode 265 may be formed on a region between regions where the first and second electrode material layers 141 and 142 are formed. A lower intermediate layer 271 may be formed between the lower structure 273 and the silicene material layer 110.

The lower structure 273 may include a material layer used as a substrate of a general electronic device, and also, may include the same material as the gate intermediate layer 261.

The gate intermediate layer 261 and the lower intermediate layer 271 may be selectively formed to protect the silicene material layer 110 or to reduce or prevent the silicene material layer 110 from reacting with other material layers. The gate intermediate layer 261 and the lower intermediate layer 271 may be formed by using a material having a low reactivity with the silicene material layer 110, for example, an insulating material, such as BN, $SiO_2$, and SiN, and as thin as possible in a thickness range from a single layer to five atom layer. When the lower structure 273 includes a material layer including the same material as the gate intermediate layer 261, the lower intermediate layer 271 may be omitted.

The gate insulating layer 263 may include a high-k material having a dielectric constant greater than silicon oxide or nitride oxide. For example, the gate insulating layer 263 may include silicon oxide, such as $SiO_2$, silicon nitride, such as $Si_3N_4$, aluminum oxide, zirconium oxide, hafnium oxide, etc.

The gate electrode 265 may include a conductive material, for example, any material, for example, a metal, a conductive metal oxide, a conductive metal nitride, a conductive polymer, etc. that is used as an electrode material in an electronic device. The gate electrode 265 may be formed on a region corresponding to a central region of the silicene material layer 110. For example, when the silicene material layer 110 includes an NPN doping region, the gate electrode 265 may be formed on a region corresponding to a region 112 which is a p-type doping region. When the silicene material layer 110 includes an NPN doping region, the gate electrode 265 may be formed to have a width equal to or slightly greater than a width of the p-type doping region (region 112). Also, when the silicene material layer 110 includes a PNP doping region, the gate electrode 265 may be formed to have a width equal to or slightly greater than a width of the n-type doping region. The gate electrode 265 may control a chemical potential of the silicene material layer 110. In particular, when the silicene material layer 110 includes a PNP doping region or an NPN doping region, the gate electrode 265 may control a chemical potential of the region 112, which is an n-type doping region or a p-type doping region.

Figure 6:
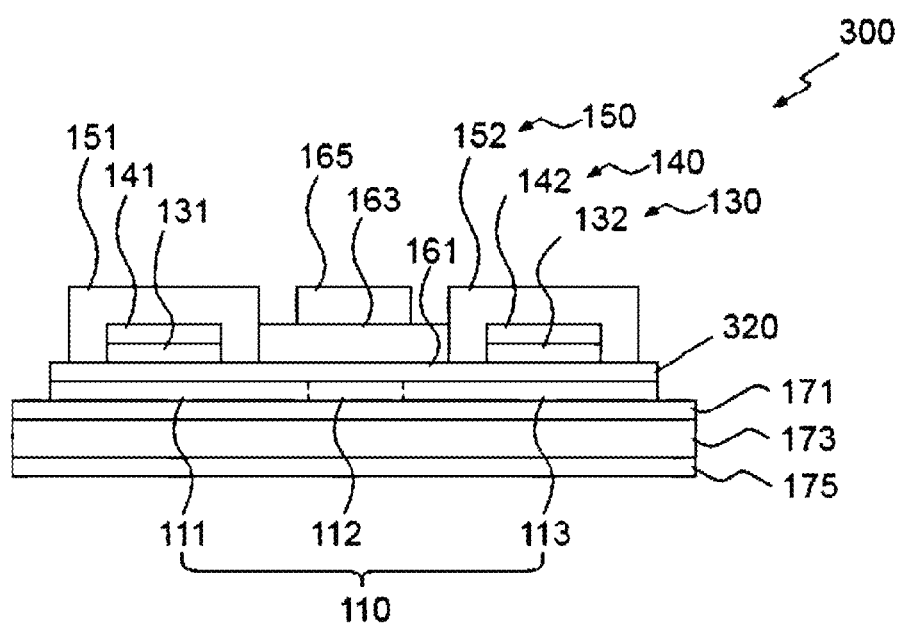
FIG. 6 is a cross-sectional view of a silicene electronic device including a silicene material layer, according to some embodiments.

FIG. 6 is a cross-sectional view of a silicene electronic device 300 including a silicene material layer 110, according to some embodiments.

Referring to FIG. 6, the silicene electronic device 300 according to some embodiments is substantially identical to the silicene electronic device 100 described with reference to FIGS. 1 through 5 except that an upper intermediate layer 320 is formed on entire upper region of the silicene material layer 110, and thus, only the differences will be described.

The upper intermediate layer 320 is formed on an entire upper region of the silicene material layer 110 to protect the silicene material layer 110 or to reduce or prevent the silicene material layer 110 from reacting with other material layers. The upper intermediate layer 320 may be formed as thin as possible using an insulating material, such as BN, SiO2, and SiN, for example, in a thickness range from a single layer to five atom layers. For example, BN does not change characteristics of silicene by joining with silicene. The upper intermediate layer 320 protects the silicene material layer 110, and furthermore, since the upper intermediate layer 320 is located between the silicene material layer 110 and the electrode material layer 140, the formation of an interface state on a surface of the silicene material layer 110 may be reduced or prevented.

Figure 7:
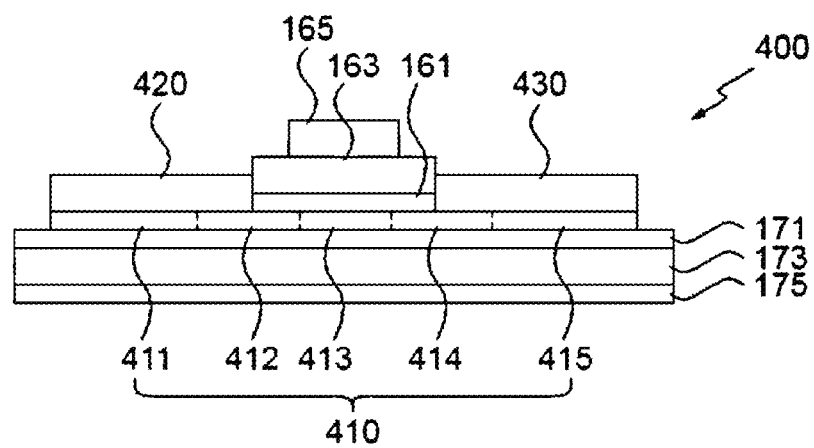
FIG. 7 is a cross-sectional view of a silicene electronic device including a silicene material layer, according to some embodiments.
Figure 8:
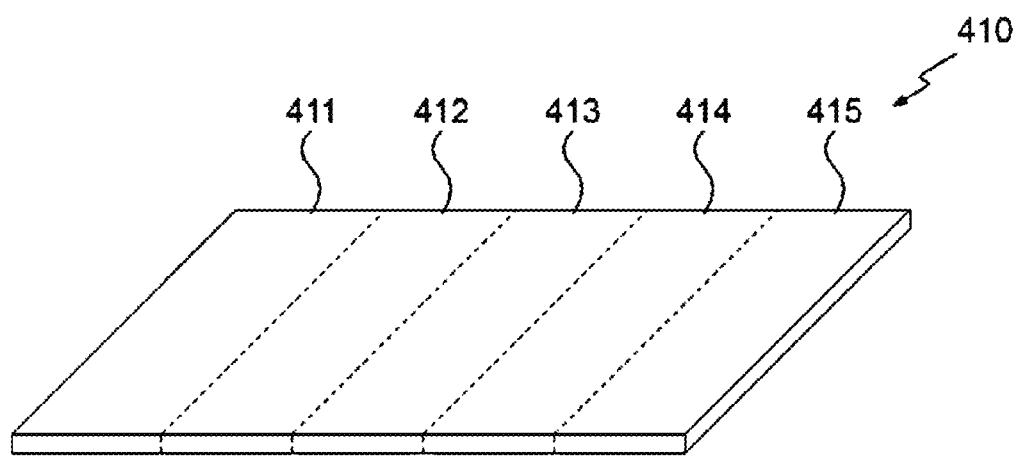
FIG. 8 is a perspective view of a silicene material layer of the silicene electronic device of FIG. 7.

FIG. 7 is a cross-sectional view of a silicene electronic device 400 including a silicene material layer 410 according to another embodiment. FIG. 8 is a perspective view of the silicene material layer 410 of the silicene electronic device 400 of FIG. 7.

Referring to FIGS. 7 and 8, the silicene electronic device 400 according to some embodiments includes a silicene material layer 410, and first and/or second electrode material layers 420 and 430 on the silicene material layer 410. An upper gate intermediate layer 161, an upper gate insulating layer 163, and/or an upper gate electrode 165 may be formed on a region of the silicene material layer 410 between regions where the first and second electrode material layers 420 and 430 are formed. A lower intermediate layer 171, a lower gate insulating layer 173, and a lower gate electrode 175 may be formed on a lower side of the silicene material layer 410.

The silicene material layer 410 may be a channel of a transistor device. As described above, a band gap of the silicene material layer 410 may be opened and controlled by primarily doping the silicene material layer 410 with at least one material of Group I, Group II, Group XVI, and Group XVII. Also, in a state that the silicene material layer 410 is primarily doped, a secondary doping of the silicene material layer 410 with a p-type dopant or an n-type dopant may be performed by using an implantation method. The p-type dopant may be B, Al, etc. and the n-type dopant may be P, etc. The secondary doping may be performed so that the silicene material layer 410 has a doping concentration of $10^{12}$~$10^{18}$/cm$^3$ with a second dopant. Furthermore, a tertiary doping may be performed by using a substitution method or an adsorption method on a portion of the region where the secondary doping is performed, and thus, a doping concentration of the tertiary doped region doped with a p-type dopant or an n-type dopant may be increased to $10^{18}$~$10^{21}$/cm$^3$. When the substitution method is used, the p-type dopant may be B, Al, etc. and the n-type dopant may be N, P, etc. When adsorption method is used, the p-type dopant may be N, and the n-type dopant may be B, Al, etc. However, dopants for the secondary and tertiary doping are not limited thereto, and any p-type dopant or n-type dopant that is generally used in a semiconductor process may be used.

Reference numerals 411 and 415 in FIG. 8 indicate tertiary doped highly doped regions, and reference numerals 412, 413, and 414 indicate secondary doped low doped regions. For example, reference numerals 411 and 415 indicate n+++ regions of the silicene material layer 410 highly doped with an n-type dopant, reference numerals 412 and 414 indicate n+ regions of the silicene material layer 410 doped with an n-type dopant, and reference numeral 413 indicates a p region of the silicene material layer 410 doped with a p-type dopant. As another example, reference numerals 411 and 415 indicate p+++ regions highly doped with a p-type dopant, reference numerals 412 and 414 indicate p+ regions of the silicene material layer 410 doped with a p-type dopant, and reference numeral 413 indicates an n region of the silicene material layer 410 doped with an n-type dopant.

The first and second electrode material layers 420 and 430 are formed on the highly doped regions 411 and 415, respectively, of the silicene material layer 410. For example, when reference numerals 411, 412, 413, 414, and 415 are an n+++ region, an n+ region, a p region, an n+ region, and an n+++ region, respectively, the first electrode material layer 420 may be located between a portion of the n+ region 412 and the n+++ region 411, the upper gate intermediate layer 161 may be located between a portion of the n+ regions 412 and 414 and the p region 413, and the second electrode material layer 430 may be located between a portion of the n+ region 414 and the n+++ region 415. The first and second electrode material layers 420 and 430 may include a metal material used in a source or drain of the related art. An area of the first electrode material layer 420 may be equal to or greater than an area of the highly doped region 411, an area of the second electrode material layer 430 may be equal to or greater than the highly doped region 415. The first and second electrode material layers 420 and 430 respectively may be understood as a source and a drain.

As described above, the silicene material layer 410 according to some embodiments is doped with a dopant by using a substitution method or an adsorption method, and thus, the silicene material layer 410 may be highly doped with a concentration of $10^{18}$~1021/cm$^3$. Therefore, although an electrode material used in a source or a drain of the related art is used in the silicene material layer 410, a height of a Schottky barrier is reduced, and as a result, an ohmic contact may be formed.

Figure 9:
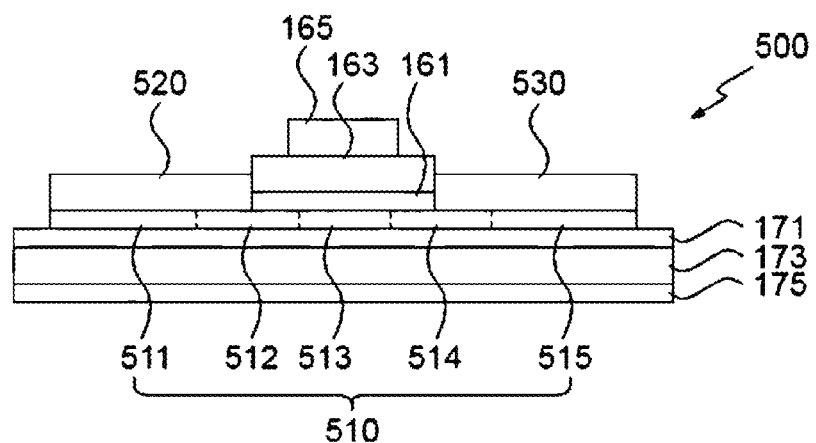
FIG. 9 is a cross-sectional view of a silicene electronic device including a silicene material layer, according to some embodiments.
Figure 10:
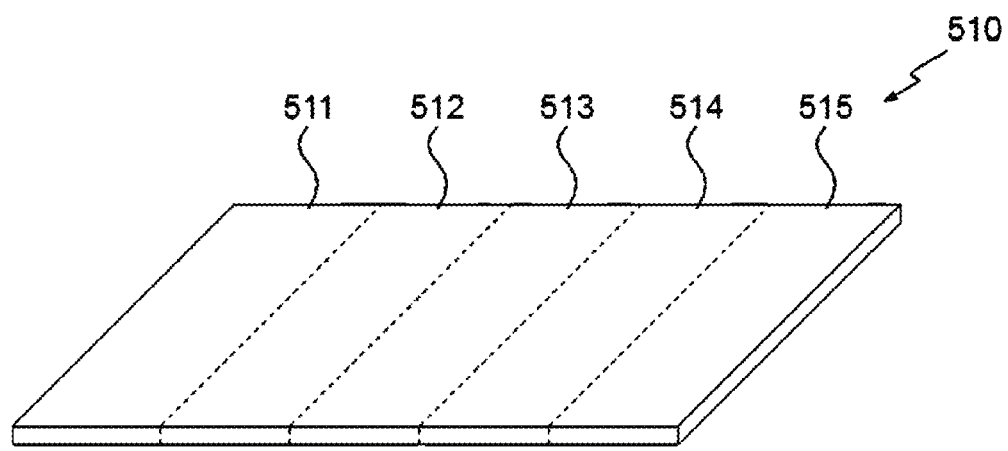
FIG. 10 is a perspective view of a silicene material layer of the silicene electronic device of FIG. 9.

FIG. 9 is a cross-sectional view of a silicene electronic device 500 including a silicene material layer 510, according to some embodiments. FIG. 10 is a perspective view of the silicene material layer 510 of the silicene electronic device 500 of FIG. 9.

Referring to FIGS. 9 and 10, the silicene electronic device 500 according to some embodiments may include the silicene material layer 510 and first and second electrode material layers 520 and 530 on the silicene material layer 510. An upper gate intermediate layer 161, an upper gate insulating layer 163, and/or an upper gate electrode 165 may be formed on a region of the silicene material layer 510 between regions where the first and second electrode material layers 520 and 530 are formed. A lower intermediate layer 171, a lower gate insulating layer 173, and/or a lower gate electrode 175 may be formed on a lower side of the silicene material layer 510.

The silicene material layer 510 may be a channel of a transistor device. The silicene material layer 510 may have a 2D structure in which silicon atoms form a hexagonal honeycomb structure, and except for a region of the silicene material layer 510, a remaining region may have a single layer structure or a bi-layer structure. Some regions of the silicene material layer 510 may be a multilayer of silicene. The silicene multilayer may include, for example, more than three layers.

As described above, a band gap of the silicene material layer 510 may be opened and controlled by primarily doping the silicene material layer 510 with at least one material of Group I, Group II, Group XVI, and Group XVII. Also, in a state that the silicene material layer 510 is primarily doped, a secondary doping of the silicene material layer 510 with a p-type dopant or an n-type dopant may be performed by using an implantation method. The p-type dopant may be B, Al, etc. and the n-type dopant may be P, etc. However, dopants for the secondary doping are not limited thereto, and any p-type dopant or n-type dopant that is generally used in a semiconductor process may be used.

In FIG. 10, reference numerals 511 and 515 indicate regions of the silicene material layer 510 where silicene multilayers are formed, and reference numerals 512 and 513 indicate regions of the silicene material layer 510 where a silicene single layer or a silicene double layer is formed. When a region of the silicene material layer 510 is formed as a silicene single layer or a silicene bi-layer, and when a secondary doping is performed by using an implantation method, due to a small thickness of silicene, a doping concentration of a secondary dopant may be limited to approximately $10^{12}$~$10^{18}$/cm$^3$. A region of the silicene material layer 510 is formed as a silicene multilayer, and the doping concentration of the secondary dopant may be increased to $10^{18}$~$10^{21}$/cm$^3$. Accordingly, in FIG. 10, regions of reference numerals indicate highly doped regions, and reference numerals 512, 513, and 514 indicate low doped regions. For example, regions of the silicene material layer 510 indicated by reference numerals 511 and 515 may be n+++ regions highly doped with an n-type dopant, regions indicated by reference numerals 512 and 514 may be n+ regions doped with an n-type dopant, and a region indicated by reference numeral 513 may be a p region doped with a p-type dopant. As another example, the regions of the silicene material layer 510 indicated by reference numerals 511 and 515 may be p+++ regions highly doped with a p-type dopant, the regions indicated by reference numerals 512 and 514 may be p+ regions doped with a p-type dopant, and the region indicated by reference numeral 513 may be an n region doped with an n-type dopant.

The first and second electrode material layers 520 and 530 respectively are formed on the highly doped regions 511 and 515 of the silicene material layer 510. When reference numerals 511, 512, 513, 514, and 515 respectively are an n+++ region, an n+ region, a p region, an n+ region, and an n+++ region, the first electrode material layer 520 may be located between a portion of the n+ region 512 and the n+++ region 511, the upper gate intermediate layer 161 may be located between portions of the n+ regions 512 and 514 and the p region 513, and the second electrode material layer 530 may be located between a portion of the n+ region 514 and the n+++ region 515.

The first and second electrode material layers 520 and 530 may include any material that is used as an electrode material in an electronic device, such as a metal, a conductive metal oxide, a conductive metal nitride, a conductive polymer, etc. An area of the first electrode material layer 520 may be equal to or greater than the area of the highly doped region 511, and an area of the second electrode material layer 530 may be equal to or greater than the area of the highly doped region 515. The first and second electrode material layers 520 and 530 respectively may be understood as a source and a drain.

As described above, in the silicene material layer 510 according to some embodiments, a region of the silicene material layer 510 for forming an ohmic contact is formed as a silicene multilayer, and thus, a doping concentration of $10^{18}$~$10^{21}$/cm$^3$ may be achieved by using an implantation method. Also, although an electrode material used in a source or drain of the related art is used as it is, a height of a Schottky barrier may be reduced, and thus, an ohmic contact may be formed.

Figure 11:
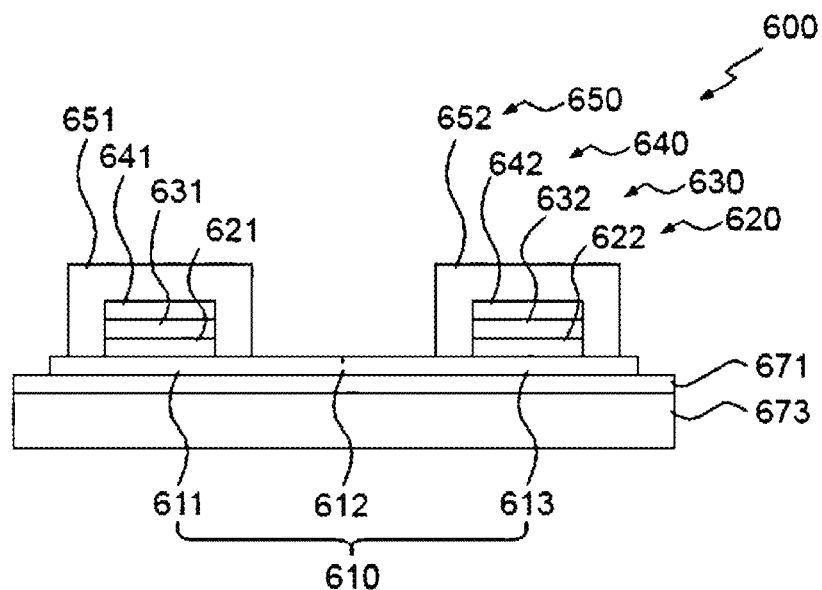
FIG. 11 is a cross-sectional view of a silicene electronic device including a silicene material layer, according to some embodiments.
Figure 12:
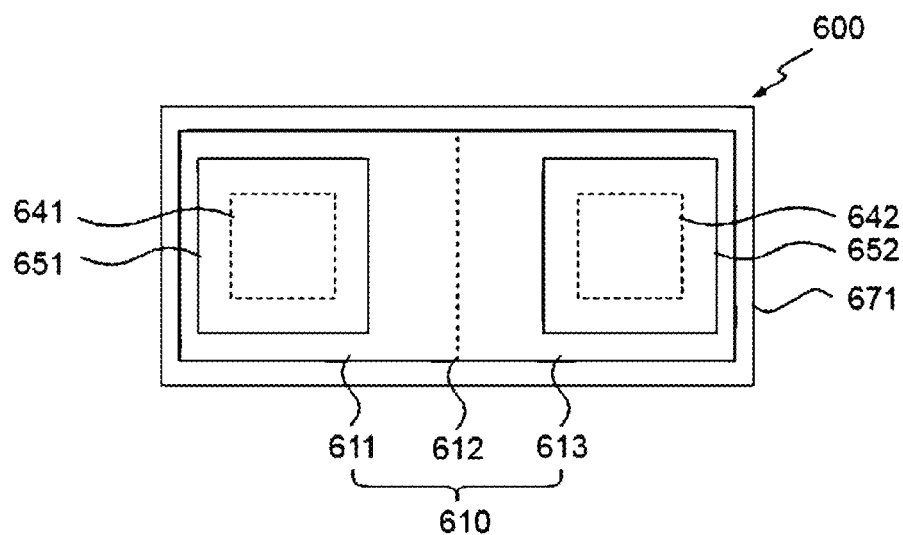
FIG. 12 is a plan view of the silicene electronic device of FIG. 11.

FIG. 11 is a cross-sectional view of a silicene electronic device 600 including a silicene material layer 610 according to some embodiments; and FIG. 12 is a plan view of the silicene electronic device 600 of FIG. 11.

Referring to FIGS. 11 and 12, the silicene electronic device 600 according to some embodiments may include the silicene material layer 610 on a lower structure 673, an intermediate layer 620, a graphene layer 630, an electrode material layer 640, and/or an electrode material protection layer 650.

The lower structure 673 may include a material layer used as a substrate of a general electronic device, and also, may be a material layer formed of the same material as a gate intermediate layer A band gap of the silicene material layer 610 may be opened and controlled by primarily doping the silicene material layer 610 with at least one material of Group I, Group II, Group XVI, and Group XVII. A region of the silicene material layer 610 may be secondary doped with a p-type dopant or an n-type dopant. For example, a first doping region 611 of the silicene material layer 610 may be a region doped with one of p-type dopant and an n-type dopant, and a second doping region 613 may be a region doped with a dopant having a polarity different from that of the first doping region 611. For example, when the first doping region 611 is a region doped with a p-type dopant, the second doping region 613 may be a region doped with an n-type dopant. Also, when the first doping region 611 is a region doped with an n-type dopant, the second doping region 613 may be a region doped with a p-type dopant.

The intermediate layer 620 may include first and second intermediate layers 621 and 622 provided on the first and second doping regions 611 and 613, respectively. The intermediate layer 620 may be provided to protect the intermediate layer 620 or to reduce or prevent the intermediate layer 620 from reacting with other material layers. The intermediate layer 620 may be formed by passivating surfaces of the regions 111 and 113 of the silicene material layer 110 or by using an insulating material, such as BN, SiO$_2$, and SiN, and may be formed as a thickness range from a single to a five atom layer.

The graphene layer 630 may include first and second graphene layers 631 and 632 formed on the first and second intermediate layers 621 and 622. The graphene layer 630 may include a single layer. The graphene layer 630 may reduce or prevent oxidation, and additionally, may further reduce work function. Also, since graphene is a 2D material like silicon, the graphene layer 630 may be readily formed on the silicene material layer 610.

The electrode material layer 640 may include first and second electrode material layers 641 and 642 formed on the first and second graphene layers 631 and 632. The first and second electrode material layers 641 and 642 may be understood as a source and a drain, respectively. The electrode material layer 640 may include a material having a work function less than the electron affinity of silicon Si. The electron affinity of silicon Si is approximately 4.05 eV, and thus, the electrode material layer 640 may include a material having a work function less than approximately 4 eV. For example, the electrode material layer 640 may include an electride, such as a C12A7 electride, a 2D electride, and a Y$_5$Si$_3$ electride. As another example, the electrode material layer 640 may include at least one material selected from the group consisting of Mg, Ca, Y, La, and Er.

The silicene electronic device 600 may further include an electrode material protection layer 650. The electrode material protection layer 650 may include first and second electrode material protection layers 651 and 652 covering the first and second electrode material layers 641 and 642, respectively.

Some or all of the intermediate layer 620, the graphene layer 630, and the electrode material protection layer 650 may be omitted depending on an electrode material of the embodiments described above.

In the silicene electronic device 600 shown in FIGS. 11 and 12, the silicene material layer 610 includes a first doping region 611 and a second doping region 613, and an intermediate region 612 may be formed between first and second doping regions 611 and 613. An electric device having the structure may be a diode type electronic device.

While embodiments of silicene electronic devices have been described with reference to the figures, it will be understood by those of ordinary skill in the art that various changes in form and details may be made therein without departing from the spirit and scope as defined by the following claims.

What is claimed is:

1. A silicene electronic device comprising:
a silicene material layer having a two-dimensional (2D) honeycomb structure formed by silicon atoms, is doped with at least one material of Group I, Group II, Group XVI, and Group XVII, and comprises a low doping concentration region lowly doped with at least one of p-type dopant or an n-type dopant, and a high doping concentration region highly doped with at least one of p-type dopant or an n-type dopant; and
an electrode material layer formed on the high doping concentration region,
wherein the silicene material layer comprises a first region formed as a single layer or a bi-layer and a second region formed as a multilayer, and the high doping concentration region may be formed in the second region.

2. The silicene electronic device of claim 1, wherein the high doping concentration region is doped by substitution of adsorption of a dopant.

3. The silicene electronic device of claim 1, wherein a doping concentration of the low doping concentration region is in a range of $10^{12} \sim 10^{18}/cm^3$, and a doping concentration of the high doping concentration region is in a range of $10^{18} \sim 10^{21}/cm^3$.

4. The silicene electronic device of claim 1, wherein at least one of the p-type dopant of the low doping concentration region and the p-type dopant of the high doping concentration region comprises Boron (B) or Aluminum (Al).

5. The silicene electronic device of claim 1, wherein at least one of the n-type dopant of the low doping concentration region and the n-type dopant of the high doping concentration region comprises Nitrogen (N) or Phosphorus (P).

6. The silicene electronic device of claim 1, wherein the electrode material layer comprises at least one material selected from the group consisting of a metal, a conductive metal oxide, a conductive metal nitride, and a conductive polymer.

7. The silicene electronic device of claim 1, wherein the silicene material layer comprises a p region doped with a p-type dopant and a first and a second n+ regions respectively doped with an n-type dopant on both sides of the p region, and the high doping concentration region comprises a first and a second n+++ regions respectively formed on portions of the first and the second n+ regions.

8. The silicene electronic device of claim 7, wherein a gate electrode is provided on the p region, and the electrode material layer comprises a source located on the first n+++ region and a portion of the first n+ region and a drain located on the second n+++ region and a portion of the second n+ region.

9. The silicene electronic device of claim 8, wherein an area of the source is equal to or greater than an area of the first n+++ region, and an area of the drain is equal to or greater than an area of the second n+++ region.

10. The silicene electronic device of claim 8, wherein a gate insulating layer is formed between the gate electrode and the silicene material layer.

11. The silicene electronic device of claim 10, wherein a gate intermediate layer is formed between the silicene material layer and the gate insulating layer.

12. The silicene electronic device of claim 11, wherein the gate intermediate layer comprises at least one material selected from the group consisting of BN, $SiO_2$, and SiN.

13. The silicene electronic device of claim 1, wherein the silicene material layer comprises a n region doped with a n-type dopant and a first and a second p+ regions respectively doped with an p-type dopant on both sides of the n region, and the high doping concentration region comprises a first and a second p+++ regions respectively formed on portions of the first and the second p+ regions.

14. The silicene electronic device of claim 13, wherein a gate electrode is provided on the n region, and the electrode material layer comprises a source located on the first p+++ region and a portion of the first p+ region and a drain located on the second p+++ region and a portion of the second p+ region.

15. The silicene electronic device of claim 1, further comprising:
a lower intermediate layer on a lower surface of the silicene material layer.

16. The silicene electronic device of claim 15, wherein the lower intermediate layer comprises at least one material selected from the group consisting of BN, $SiO_2$, and SiN.

17. The silicene electronic device of claim 16, further comprising:
a lower gate insulating layer and a lower gate electrode on a lower side of the silicene material layer.

18. The silicene electronic device of claim 17, wherein the lower gate electrode has a width equal to or greater than a width corresponding to the low doping concentration region and the high doping concentration region of the silicene material layer.

* * * * *